US012604497B2

(12) United States Patent
Hu

(10) Patent No.: US 12,604,497 B2
(45) Date of Patent: Apr. 14, 2026

(54) THIN FILM TRANSISTOR AND ARRAY SUBSTRATE

(71) Applicant: TCL China Star Optoelectronics Technology Co., Ltd., Shenzhen (CN)

(72) Inventor: Xiaobo Hu, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 698 days.

(21) Appl. No.: 17/266,655

(22) PCT Filed: Dec. 30, 2020

(86) PCT No.: PCT/CN2020/141591
§ 371 (c)(1),
(2) Date: Sep. 15, 2023

(87) PCT Pub. No.: WO2022/141241
PCT Pub. Date: Jul. 7, 2022

(65) Prior Publication Data
US 2024/0047548 A1 Feb. 8, 2024

(30) Foreign Application Priority Data
Dec. 28, 2020 (CN) .......................... 202011577558.8

(51) Int. Cl.
| *H10D 30/67* | (2025.01) |
| *H10D 64/62* | (2025.01) |
| *H10D 64/66* | (2025.01) |
| *H10D 86/60* | (2025.01) |
| *H10D 86/40* | (2025.01) |

(52) U.S. Cl.
CPC ..... *H10D 30/6739* (2025.01); *H10D 30/6737* (2025.01); *H10D 64/62* (2025.01); *H10D 64/669* (2025.01); *H10D 86/60* (2025.01); *H10D 86/441* (2025.01)

(58) Field of Classification Search
CPC ..... H10D 30/6737–6739; H10D 64/62; H10D 64/667; H10D 64/669; H10D 86/441
See application file for complete search history.

(56) References Cited

U.S. PATENT DOCUMENTS

| 2009/0173944 A1 | 7/2009 | Chen et al. |
| 2016/0118501 A1 * | 4/2016 | Nabatame ............ H10D 30/673 257/43 |

FOREIGN PATENT DOCUMENTS

| CN | 104716202 | 6/2015 |
| CN | 108321171 | 7/2018 |
(Continued)

*Primary Examiner* — Yu Chen

(57) ABSTRACT

The present application discloses a thin film transistor and an array substrate. The thin film transistor includes a gate electrode, a source electrode, and a drain electrode, and at least one of the gate electrode, the source electrode, or the drain electrode is a composite film layer. The composite film layer includes a metal layer, a low reflection functional layer, and an alloy layer which are arranged in layers. The alloy layer covering a surface of the low reflection functional layer can enhance stability of the low reflection functional layer. Because adhesion between the alloy layer and dielectric layers such as silicon oxide, silicon nitride, and silicon oxynitride is stronger than that of the low reflection functional layer, the bulge phenomenon is not easy to occur under a high temperature environment.

16 Claims, 3 Drawing Sheets

(56)  References Cited

FOREIGN PATENT DOCUMENTS

| | | |
|---|---|---|
| CN | 108598157 | 9/2018 |
| CN | 109003943 | 12/2018 |
| CN | 110767660 | 2/2020 |
| CN | 111834446 | 10/2020 |
| CN | 111081766 | 4/2022 |
| JP | H10-307296 | 11/1998 |
| JP | 2020-181866 | 11/2020 |

* cited by examiner

10

15 (16)      14        12        15 (16)      203

17

13

11

100

141
140
130
120
110

100

141
140
130
122
121
110

120

120
110

<u>100</u>

<u>200</u>

300

THIN FILM TRANSISTOR AND ARRAY SUBSTRATE

RELATED APPLICATIONS

This application is a National Phase of PCT Patent Application No. PCT/CN2020/141591 having International filing date of Dec. 30, 2020, which claims the benefit of priority of Chinese Patent Application No. 202011577558.8 filed on Dec. 28, 2020. The contents of the above applications are all incorporated by reference as if fully set forth herein in their entirety.

FIELD AND BACKGROUND OF THE INVENTION

The present application relates to the display field, and particularly to a thin film transistor and an array substrate.

With vigorous development of display technology, large-sized display screens have become the most attractive development and favored by the market. Large size TFT products are all made of copper, especially hot 8K products. The number of copper processes is very large, accounting for 20% of a whole pixel area. Reflectivity of copper film in visible light is more than 70%, and the copper film is not blocked above. When the visible light reaches a surface of the copper film, it will cause reflection, resulting in high reflectivity of the product, affecting visual effect and not being able to meet needs of high-level products.

Molybdenum oxide film has low reflectivity, the lowest being 5%, which is far less than copper film. Therefore, in the prior art, a low reflection molybdenum oxide film is generally arranged above a metal wire to reduce reflectivity of the product. Due to looseness of molybdenum oxide film and poor adhesion between molybdenum oxide film and dielectric layers such as silicon oxide, silicon nitride, and silicon oxynitride, the dielectric layers such as silicon oxide, silicon nitride, and silicon oxynitride above the molybdenum oxide film are prone to bulge especially after high temperature processing, which leads to the film falling off and affecting a yield of the product.

Therefore, in view of the above defects existing in the prior art, urgent improvement is needed.

SUMMARY OF THE INVENTION

The present application provides a thin film transistor and an array substrate, which is used to solve the problem that the film layer of the thin film transistor falls off due to the poor adhesion between the molybdenum oxide film and the dielectric layers such as silicon oxide, silicon nitride and silicon oxynitride in the prior art.

In order to solve the above problem, the present application provides a thin film transistor, comprising a substrate, the thin film transistor further comprising:

a gate electrode disposed on a side surface of the substrate;

a gate insulating layer covering the gate electrode and the substrate;

an active layer disposed on a side surface of the gate insulating layer away from the gate electrode;

a source electrode and a drain electrode disposed on the side surface of the active layer away from the gate insulating layer;

a passivation layer configured to cover the active layer, the source electrode, and the drain electrode;

wherein at least one of the gate electrode, the source electrode, or the drain electrode is a composite film layer, and the composite film layer comprises a first metal layer, a second metal layer, a low reflection functional layer, and an alloy layer which are arranged in layers.

Alternatively, in some embodiments of the present application, the alloy layer is formed by implanting metal ions into the low reflection functional layer.

Alternatively, in some embodiments of the present application, an implantation depth of the metal ions is less than a thickness of the low reflection functional layer.

Alternatively, in some embodiments of the present application, the first metal layer and the second metal layer are laminated layers comprising at least one or more of molybdenum, copper, aluminum, and silver.

Alternatively, in some embodiments of the present application, the low reflection functional layer is a metal oxide layer.

Alternatively, in some embodiments of the present application, the low reflection functional layer is a metal oxide layer.

Alternatively, in some embodiments of the present application, the alloy layer is a metal oxide layer implanted with metal ions.

Alternatively, in some embodiments of the present application, the first metal layer is a molybdenum layer, the second metal layer is a copper layer, the low reflection functional layer is a molybdenum oxide layer, and the alloy layer is a molybdenum oxide layer implanted with metal ions.

Alternatively, in some embodiments of the present application, a relative atomic mass ratio of the metal ion to the molybdenum atom in the alloy layer ranges from 0.005 to 0.5.

Alternatively, in some embodiments of the present application, the metal ion comprises at least one of tantalum ion, niobium ion, titanium ion, nickel ion, or tungsten ion.

Alternatively, in some embodiments of the present application, the gate insulating layer and the passivation layer are made of a material comprising at least one of silicon oxide, silicon nitride, or silicon oxynitride.

Alternatively, in some embodiments of the present application, a source electrode, and a drain electrode, wherein at least one of the gate electrode, the source electrode, or the drain electrode is a composite film layer, and the composite film layer comprises a metal layer, a low reflection functional layer and an alloy layer which are arranged in layers.

Alternatively, in some embodiments of the present application, the metal layer comprises a first metal layer and a second metal layer;

wherein the first metal layer is disposed on a substrate;

wherein the second metal layer is arranged between the first metal layer and the low reflection functional layer.

Alternatively, in some embodiments of the present application, the alloy layer is formed by implanting metal ions into the low reaction functional layer.

Alternatively, in some embodiments of the present application, an implantation depth of the metal ions is less than the thickness of the low reflection functional layer.

Alternatively, in some embodiments of the present application, an implantation depth of the metal ions is equal to the thickness of the low reflection functional layer.

Alternatively, in some embodiments of the present application, the metal ions comprise at least one of tantalum ion, niobium ion, titanium ion, nickel ion, or tungsten ion.

Alternatively, in some embodiments of the present application, the metal layer is laminated layers comprising at least one or more of molybdenum, copper, aluminum, and silver, the low reflection functional layer is a metal oxide layer, and the alloy layer is a metal oxide layer implanted with metal ions.

Alternatively, in some embodiments of the present application, the first metal layer is a molybdenum layer; the second metal layer is a copper layer, the low reflection functional layer is a molybdenum oxide layer, and the alloy layer is a molybdenum oxide layer implanted with metal ions.

Alternatively, in some embodiments of the present application, the relative atomic mass ratio of the metal ion to the molybdenum atom in the alloy layer ranges from 0.005 to 0.5.

Correspondingly, the present application also provides an array substrate, comprising the thin film transistor of any of the above embodiments.

Compared with the prior art, the thin film transistor and the array substrate of the present application arrange at least one of the gate electrode, the source electrode, or the drain electrode as a composite film layer. The composite film layer comprises a first metal layer, a second metal layer, and a low reflection functional layer. The first metal layer is arranged on a base substrate and serves as the main electrode layer together with the second metal layer. The first metal layer can improve the adhesion between the second metal layer and the base substrate. The low reflection functional layer is located on the side surface of the first metal layer away from the base substrate, and the low reflection functional layer is a metal oxide layer, which can greatly reduce the reflectivity of the second metal layer.

Furthermore, the composite film layer also comprises an alloy layer, which is arranged on the side surface of the low reflection functional layer far away from the first metal layer. The hardness of the alloy layer is greater than that of the metal oxide layer, and covering the surface of the metal oxide layer can enhance the stability of the metal oxide layer. Because the alloy layer is formed by implanting metal ions into the metal oxide layer, the density of the alloy layer is greater than that of the metal oxide layer, the adhesion between the alloy layer and the dielectric layers such as silicon oxide, silicon nitride, and silicon oxynitride is stronger than that of the metal oxide layer, and the bulge phenomenon is not easy to occur under high temperature environment. Thus, the dielectric layers such as silicon oxide, silicon nitride, and silicon oxynitride on the surface of the composite film layer can be prevented from falling off, and the yield of the product can be improved.

BRIEF DESCRIPTION OF THE SEVERAL VIEWS OF THE DRAWINGS

The technical solution and other beneficial effects of the present application will be obvious through the detailed description of the specific embodiments of the present application in combination with the drawings.

The main reference marks in the above drawings are as follows:

10. Thin film transistor; 11. Substrate; 12. Gate electrode; 13. gate insulating layer; 14. Active layer; 15. Source electrode; 16. Drain electrode; 17. Passivation layer; 100. Composite film layer; 110, base substrate; 120. metal layer; 121. first metal layer; 122. second metal layer; 130. low reflection function layer; 140. alloy layer; 141. metal ions; 200. array substrate; 201. glass substrate; 202. pixel electrode layer; 300. display panel; 301. liquid crystal layer; 302. Color film substrate.

DESCRIPTION OF SPECIFIC EMBODIMENTS OF THE INVENTION

The technical solution in the embodiments of the application will be described clearly and completely in combination with the drawings. Obviously, the described embodiments are only a part of the embodiments of the present application, rather than all the embodiments. Based on the embodiments of the present application, all other embodiments obtained by those skilled in the art without creative work fall within the protection scope of the present application.

The present application provides a thin film transistor, which comprises a gate electrode, a source electrode, and a drain electrode. At least one of the gate electrode, the source electrode, or the drain electrode is a composite film layer, and the outermost layer of the composite film layer is an alloy layer.

Figure 1:
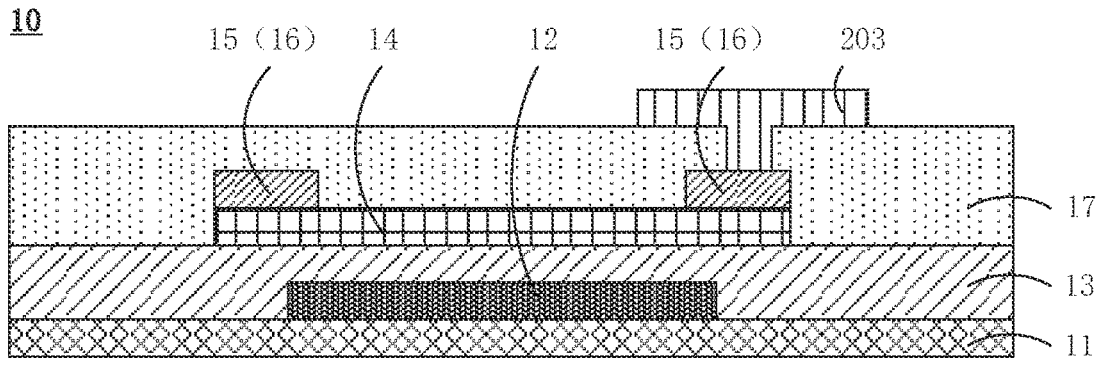
FIG. 1 is a structural schematic diagram of one embodiment of a thin film transistor of the present application.
Figure 2:
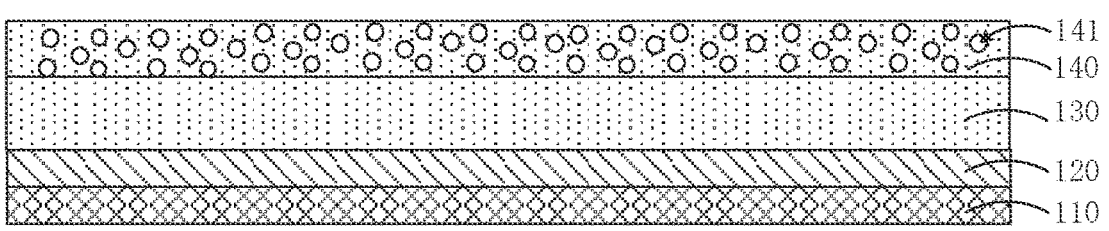
FIG. 2 is a structural schematic diagram of an embodiment of a composite film layer of the thin film transistor in the present application.

Referring to FIG. 1 and FIG. 2, FIG. 1 is a structural schematic diagram of one embodiment of the thin film transistor of the present application. FIG. 2 is a structural schematic diagram of an embodiment of the composite film layer of the thin film transistor in the present application.

In this embodiment, the thin film transistor 10 comprises: a substrate 11; a gate electrode 12 disposed on the substrate 11; a gate insulating layer 13 covering the gate electrode 12 and the substrate 11; an active layer 14 disposed on the gate insulating layer 13; a source electrode 15 and a drain electrode 16 disposed on the active layer 14 and connected with the active layer 14; and a passivation layer 17 covering the active layer 14, the source electrode 15, and the drain electrode 16. In the array substrate of the present application, a pixel electrode layer 202 is arranged on the passivation layer 17, and the pixel electrode layer 202 is connected with the source electrode 15 or the drain electrode 16 through a via.

At least one of the gate electrode 12, the source electrode 15, or the drain electrode 16 is a composite film layer 100. It can be understood by those skilled in the art that the number of the composite film layer 100 in the gate electrode 12, the source electrode 15, and the drain electrode 16 is not limited. Preferably, the gate electrode 12, the source electrode 15, and the drain 16 electrode are all composite film layers 100.

As shown in FIG. 2, in the present application, the outermost layer of the composite film 100 is an alloy layer. Specifically, the composite film layer 100 comprises a metal layer 120 arranged on a base substrate 110, a low reflection functional layer 130 covering the metal layer 120, and an alloy layer 140 located on the side surface of the low reflection functional layer 130 away from the metal layer 120. The alloy layer 140 is located at the outermost layer of the composite film layer 100. The metal layer 120 is laminated layers comprising at least one or more of molybdenum, copper, aluminum, and silver. The low reflection functional layer 130 is a metal oxide layer, and the alloy layer 140 is a metal oxide layer implanted with metal ions 141. Wherein, the metal ions 141 comprise at least one of tantalum ion, niobium ion, titanium ion, nickel ion, or tungsten ion. It can be understood by those skilled in the art that a variety of different metal ions 141 can be simultaneously implanted into the metal oxide layer to form the alloy layer 140. For example, the alloy layer 140 is an alloy material composed of metal oxide and tantalum ion, the alloy layer 140 is an alloy material composed of metal oxide and nickel ion, and the alloy layer 140 is an alloy material composed of metal oxide, tantalum ion and niobium ion.

Figure 3:
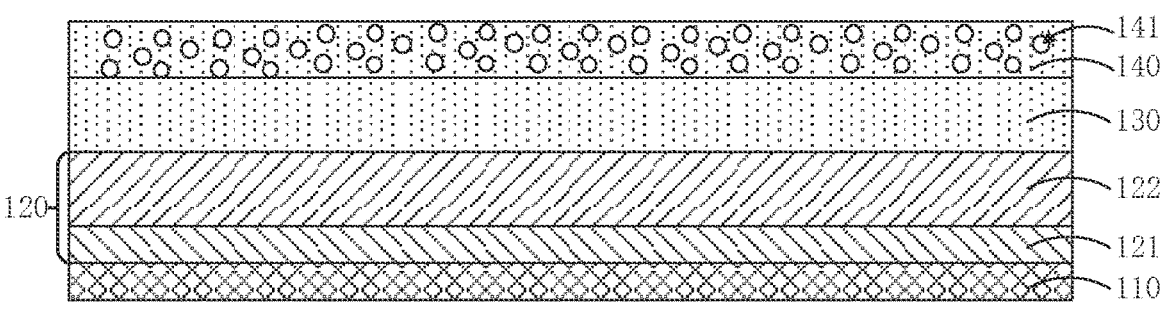
FIG. 3 is a structural schematic diagram of another embodiment of the composite film layer of the thin film transistor in the present application.

As shown in FIG. 3, in an embodiment of the present application, the outermost layer of the composite film 100 is an alloy layer, and the metal layer 120 comprises a first metal layer 121 and a second metal layer 122. Specifically, the composite film layer 100 comprises a first metal layer 121 arranged on a base substrate 110, a second metal layer 122 covering the first metal layer 121, a low reflection functional layer 130 covering the second metal layer 122, and an alloy layer 140 located on the side surface of the low reflection functional layer 130 away from the first metal layer 121. The alloy layer 140 is located at the outermost layer of the composite film layer 100. Wherein, the first metal layer 121 is laminated layers comprising at least one or more of molybdenum, copper, aluminum, and silver. The second metal layer 122 is laminated layers comprising at least one or more of molybdenum, copper, aluminum, and silver. The low reflection functional layer 130 is a metal oxide layer. The alloy layer 140 is a metal oxide layer implanted with metal ions 141. Wherein, the metal ions 141 comprise at least one of tantalum ion, niobium ion, titanium ion, nickel ion, or tungsten ion. It can be understood by those skilled in the art that a variety of different metal ions 141 can be simultaneously implanted into the metal oxide layer to form the alloy layer 140. For example, the alloy layer 140 is an alloy material composed of metal oxide and tantalum ion, the alloy layer 140 is an alloy material composed of metal oxide and nickel ion, and the alloy layer 140 is an alloy material composed of metal oxide, tantalum ion and niobium ion. Preferably, the first metal layer 121 is a molybdenum layer, the second metal layer 122 is a copper layer, the low reflection functional layer 130 is a molybdenum oxide layer, and the alloy layer 140 is a molybdenum oxide layer implanted with tantalum ions.

In the present application, the first metal layer 121 and the second metal layer 122 are laminated layers comprising at least one or more of molybdenum, copper, aluminum, and silver. The first metal layer 121 is in contact with the base substrate 110, so preferably, the adhesion between the material of the first metal layer 121 and the base substrate 110 is greater than that between the material of the second metal layer 122 and the base substrate 110.

In some embodiments of the present application, the implantation depth of the metal ions 141 is less than or equal to the thickness of the metal oxide layer. It can be understood by those skilled in the art that when the implantation depth of the metal ions 141 is equal to the thickness of the metal oxide layer, the film structure of the composite film 100 comprises a first metal layer 121 arranged on a base substrate 110, a second metal layer 122 covering the first metal layer 121, and an alloy layer 140 covering the second metal layer 122. At this time, the low reflection functional layer 130 is completely replaced by the alloy layer 140. Preferably, the implantation depth of the metal ions 141 is less than the thickness of the metal oxide layer, that is, the low reflection functional layer 130 and the alloy layer 140 exist simultaneously.

In the present application, the relative atomic mass ratio of the metal ions 141 and the molybdenum atom in the alloy layer 140 ranges from 0.005 to 0.5. It can be understood by those skilled in the art that when a variety of different metal ions 141 are implanted into the metal oxide layer at the same time to form the alloy layer 140, the relative atomic mass ratio of the metal ions 141 to the molybdenum atom ranges from 0.005 to 0.5, specifically, the sum of the relative atomic mass ratio of a variety of different metal ions 141 to the molybdenum atom ranges from 0.005 to 0.5. For example, the alloy layer 140 is an alloy material composed of molybdenum oxide, tantalum ion and niobium ion, and the relative atomic mass ratio of the metal ions 141 to molybdenum atom refers to the sum of the relative atomic mass ratio of tantalum ion and niobium ion to molybdenum atom respectively; the alloy layer 140 is an alloy material composed of molybdenum oxide and tantalum ion, niobium ion, titanium ion, nickel ion and tungsten ion, and the relative atomic mass ratio of the metal ions 141 to molybdenum atom refers to the sum of relative atomic mass ratio of tantalum ion, niobium ion, titanium ion, nickel ion and tungsten ion to molybdenum atom respectively. The relative atomic mass ratio of the metal ions 141 to the molybdenum atom in the alloy layer 140 is not limited by the type of the metal ions 141.

In the present application, when the gate electrode 12 is the composite film layer 100, the base substrate 110 is the substrate 11. When the source electrode 15 or the drain electrode 16 is the composite film layer 100, the base substrate 110 is the active layer 14. It can be understood by those skilled in the art that the base substrate 110 in the composite film 100 is essentially the film contacted by the first metal layer 121 in the gate 12, the source 15, and the drain 16 away from the second metal layer 122, that is, the base substrate 110 is not a necessary structure of the composite film 100.

It should be noted that the thin film transistor 10 in the present application can be a bottom gate structure, such as a back channel etching structure and an etching blocking structure. The thin film transistor 10 can also be a top gate structure, and the structure of the thin film transistor 10 is not limited to FIG. 1, as long as at least one of the gate electrode 12, the source electrode 15, or the drain electrode 16 in the application is a composite film layer 100.

In the present application, other films of the thin film transistor 10 can be made of a material comprising conventional materials in the prior art. For example, the substrate 11 is a polyimide substrate or a glass substrate; the gate insulating layer 13 and the passivation layer 17 are made of a material comprising at least one of silicon oxide, silicon nitride, or silicon oxynitride; the active layer 14 is made of amorphous silicon or polysilicon material, and the pixel electrode layer 202 is made of indium tin oxide alloy material. Specifically, the materials can be selected according to the actual situation, and the application is not limited.

Figure 4A:
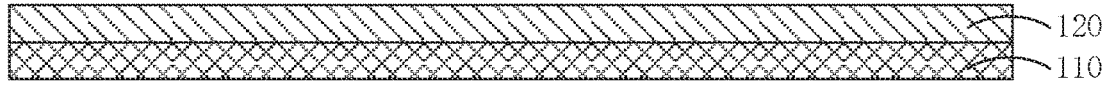
FIGS. 4A to 4C are preparation structure schematic diagrams of the composite film layer of the thin film transistor in one of the embodiments of the present application.
Figure 4B:
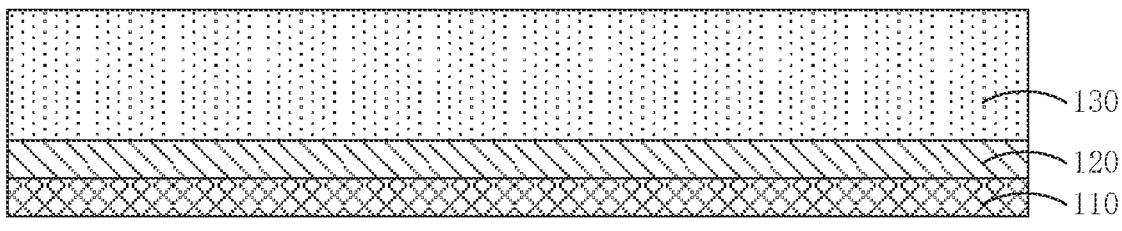
Figure 4C:
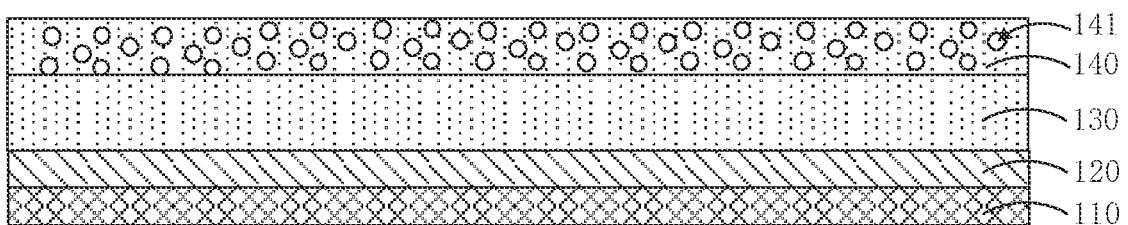
Figure 5:
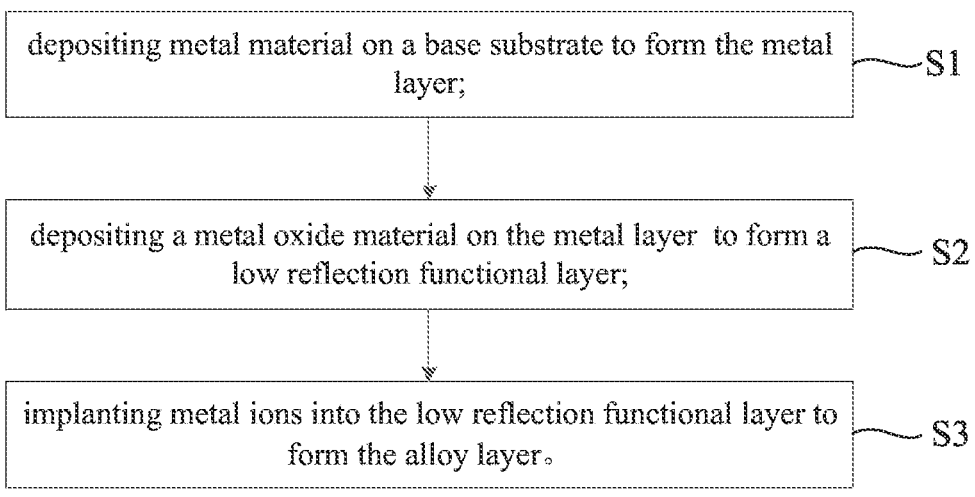
FIG. 5 is a schematic diagram of preparation flow of the composite film layer of the thin film transistor in one of the embodiments of the present application.

Refer to FIGS. 4A to 4C and FIG. 5, FIGS. 4A to 4C are the preparation structure schematic diagrams of the composite film layer of the thin film transistor in one of the embodiments of the present application; FIG. 5 is a schematic diagram of the preparation flow of the composite film layer of the thin film transistor in one of the embodiments of the present application. The present application also provides a preparation method of the composite film layer 100, comprising the following steps:

As shown in FIG. 4A and FIG. 5, step S1: depositing metal material on a base substrate 110 to form the metal layer 120.

As shown in FIG. 4B and FIG. 5, step S2: depositing a metal oxide material on the metal layer 120 to form a low reflection functional layer 130.

As shown in FIG. 4C and FIG. 5, step S3: implanting metal ions 141 into the low reflection functional layer 130 to form the alloy layer 140.

In the present application, the composite film layer 100 can be the gate electrode 12, source electrode 15, and drain electrode 16 of any type of thin film transistor 10 in the art. The thin film transistor 10 can be used in TFT-LCD, OLED, mini LED, micro LED, and other display devices without limitation.

In the thin film transistor 10 described in the present application, at least one of the gate electrode 12, the source electrode 15, or the drain electrode 16 is the composite film layer 100. The composite film layer 100 comprises a first metal layer 121, a second metal layer 122, and a low reflection functional layer 130. The first metal layer 121 is arranged on a base substrate 110 and serves as the main electrode layer together with the second metal layer 122. The first metal layer 121 can improve the adhesion between the second metal layer 122 and the base substrate 110. The low reflection functional layer 130 is located on the side surface of the first metal layer 121 away from the base substrate 110, and the low reflection functional layer 130 is a metal oxide layer, which can greatly reduce the reflectivity of the second metal layer 122.

Furthermore, the composite film layer 100 also comprises an alloy layer 140 arranged on the side surface of the low reflection functional layer 130 away from the first metal layer 121. The hardness of the alloy layer 140 is greater than that of the metal oxide layer, and covering the surface of the metal oxide layer can enhance the stability of the metal oxide layer. Because the alloy layer 140 is formed by implanting metal ions 141 into the metal oxide layer, the density of the alloy layer 140 is greater than that of the metal oxide layer, and the adhesion between the alloy layer 140 and the dielectric layers such as silicon oxide, silicon nitride, and silicon oxynitride is stronger than that of the metal oxide layer, and the bulge phenomenon is not easy to occur under the high temperature environment. Thus the dielectric layers such as silicon oxide, silicon nitride, and silicon oxynitride on the surface of the composite film layer can be prevented from falling off, and the yield of the product can be improved.

Figure 6:
FIG. 6 is a structural schematic diagram of an array substrate in one of the embodiments of the present application.

The present application also provides an array substrate, which adopts a plurality of thin film transistors 10 as described above, and the thin film transistor 10 is used in a pixel unit driving circuit. In the embodiment shown in FIG. 6, the array substrate 200 comprises a glass substrate 201, a thin film transistor layer 10 arranged on the glass substrate 201, and a pixel electrode layer 202 arranged on the thin film transistor. The thin film transistor 10 adopts the structure of the above-mentioned thin film transistor 10.

Figure 7:
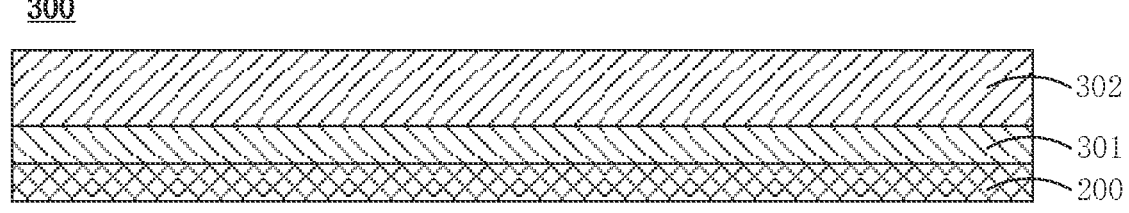
FIG. 7 is a structural schematic diagram of a display panel in one of the embodiments of the present application.

The present application also provides a display panel 300. The display panel 300 comprises the array substrate 200, which is a TFT array substrate and adopts the thin film transistor as described above. In the embodiment shown in FIG. 7, the display panel 300 comprises an array substrate 200, a liquid crystal layer 301, and a color film substrate 302.

In the above embodiments, the description of each embodiment has its own emphasis. For the part not detailed in one embodiment, please refer to the related description of other embodiments.

The thin film transistor 10 provided by the embodiments of the present application is described in detail above. In this paper, specific examples are used to explain the principles and implementations of the present application. The description of the above embodiment is only used to help understand the technical solution and core idea of the present application. It should be understood by those skilled in the art that they can still modify the technical solutions recorded in the above-mentioned embodiments, or replace some of the technical features equally; and these modifications or substitutions do not make the essence of the corresponding technical solutions out of the scope of the technical solutions of the embodiments of the present application.

What is claimed is:

1. A thin film transistor comprising a substrate, the thin film transistor further comprising:
a gate electrode disposed on a side surface of the substrate;
a gate insulating layer covering the gate electrode and the substrate;
an active layer disposed on a side surface of the gate insulating layer away from the gate electrode;
a source electrode and a drain electrode disposed on a side surface of the active layer away from the gate insulating layer;
a passivation layer configured to cover the active layer, the source electrode, and the drain electrode;
wherein at least one of the gate electrode, the source electrode, or the drain electrode is a composite film layer, and the composite film layer comprises a first metal layer, a second metal layer, a low reflection functional layer, and an alloy layer which are arranged in layers,
wherein the alloy layer comprises metal ions dispersed inside a first metal oxide layer, the metal ions comprise at least one of tantalum ion, niobium ion, titanium ion, nickel ion, or tungsten ion, and
wherein the low reflection functional layer is a second metal oxide layer without any metal ions.

2. The thin film transistor of claim 1, wherein the alloy layer is formed by implanting the metal ions into the first metal oxide layer.

3. The thin film transistor of claim 2, wherein the second metal oxide layer is between the second metal layer and the first metal oxide layer.

4. The thin film transistor of claim 1, wherein the first metal layer and the second metal layer are laminated layers comprising at least one or more of molybdenum, copper, aluminum, and silver.

5. The thin film transistor of claim 1, wherein the low reflection functional layer and the alloy layer comprises a same metal oxide.

6. The thin film transistor of claim 1, wherein the first metal layer is a molybdenum layer, the second metal layer is a copper layer, the low reflection functional layer is a molybdenum oxide layer, and the alloy layer is a molybdenum oxide layer implanted with the metal ions.

7. The thin film transistor of claim 6, wherein a relative atomic mass ratio of the metal ions to molybdenum atom in the alloy layer ranges from 0.005 to 0.5.

8. The thin film transistor of claim 1, wherein the gate insulating layer and the passivation layer are made of a material comprising at least one of silicon oxide, silicon nitride, or silicon oxynitride.

9. A thin film transistor, comprising a gate electrode, a source electrode, and a drain electrode, wherein at least one of the gate electrode, the source electrode, or the drain electrode is a composite film layer, and the composite film layer comprises a metal layer, a low reflection functional layer, and an alloy layer which are arranged in layers, wherein the alloy layer comprises metal ions dispersed inside a first metal oxide layer, the metal ions comprise at least one of tantalum ion, niobium ion, titanium ion, nickel ion, or tungsten ion, and wherein the low reflection functional layer is a second metal oxide layer without any metal ions.

10. The thin film transistor of claim 9, wherein the metal layer comprises a first metal layer and a second metal layer;

wherein the first metal layer is disposed on a substrate; and wherein the second metal layer is arranged between the first metal layer and the low reflection functional layer.

11. The thin film transistor of claim 10, wherein the first metal layer is a molybdenum layer, the second metal layer is a copper layer, the low reflection functional layer is a molybdenum oxide layer, and the alloy layer is a molybdenum oxide layer implanted with the metal ions.

12. The thin film transistor of claim 11, wherein a relative atomic mass ratio of the metal ions to molybdenum atom in the alloy layer ranges from 0.005 to 0.5.

13. The thin film transistor of claim 9, wherein the alloy layer is formed by implanting the metal ions into the first metal oxide layer.

14. The thin film transistor of claim 13, wherein the second metal oxide layer is between the metal layer and the first metal oxide layer.

15. The thin film transistor of claim 9, wherein the metal layer is laminated layers comprising at least one or more of molybdenum, copper, aluminum, and silver, the low reflection functional layer is a molybdenum oxide layer, and the alloy layer is a molybdenum oxide layer implanted with the metal ions.

16. An array substrate, comprising the thin film transistor of claim 9.

* * * * *